(12) United States Patent
Wolford et al.

(10) Patent No.: US 7,593,279 B2
(45) Date of Patent: Sep. 22, 2009

(54) CONCURRENT STATUS REGISTER READ

(75) Inventors: Barry Joe Wolford, Cary, NC (US); James Edward Sullivan, Jr., Cary, NC (US)

(73) Assignee: QUALCOMM Incorporated, San Diego, CA (US)

(*) Notice: Subject to any disclaimer, the term of this patent is extended or adjusted under 35 U.S.C. 154(b) by 72 days.

(21) Appl. No.: 11/548,430

(22) Filed: Oct. 11, 2006

(65) Prior Publication Data
US 2008/0089138 A1 Apr. 17, 2008

(51) Int. Cl.
*G11C 11/00* (2006.01)
(52) U.S. Cl. .................. 365/220; 365/230.06
(58) Field of Classification Search ............ 365/230.06, 365/220
See application file for complete search history.

(56) References Cited

U.S. PATENT DOCUMENTS

| | | | | |
|---|---|---|---|---|
| 4,363,108 A * | 12/1982 | Lange et al. | ................. | 345/467 |
| 5,216,672 A | 6/1993 | Tatosian et al. | | |
| 5,640,521 A * | 6/1997 | Whetsel | .................. | 710/316 |
| 5,963,482 A | 10/1999 | Zheng | | |
| 6,049,856 A * | 4/2000 | Bolyn | .................. | 711/168 |
| 6,154,816 A * | 11/2000 | Steely et al. | ................. | 711/150 |
| 6,236,593 B1 * | 5/2001 | Hong et al. | ............ | 365/185.11 |
| 6,279,084 B1 * | 8/2001 | VanDoren et al. | ............ | 711/141 |
| 6,430,634 B1 * | 8/2002 | Mito | .................. | 710/100 |
| 6,594,748 B1 * | 7/2003 | Lin | .................. | 711/167 |
| 6,665,755 B2 * | 12/2003 | Modelski et al. | ............ | 710/100 |
| 7,024,518 B2 | 4/2006 | Halbert et al. | | |
| 7,055,012 B2 | 5/2006 | LaBerge et al. | | |
| 7,230,876 B2 * | 6/2007 | Walker | .................. | 365/230.01 |
| 2001/0011318 A1 | 8/2001 | Vishram | | |
| 2003/0126353 A1 * | 7/2003 | Satoh et al. | ................. | 711/100 |
| 2005/0076169 A1 * | 4/2005 | Modelski et al. | ............ | 710/100 |
| 2005/0289428 A1 * | 12/2005 | Ong | .................. | 714/742 |
| 2006/0181957 A1 * | 8/2006 | Walker | .................. | 365/233 |

OTHER PUBLICATIONS

International Search Report PCT/US2007/080779, International Search Authority Europeoan Patent Office, Jun. 5, 2008.

* cited by examiner

*Primary Examiner*—Michael T Tran
(74) *Attorney, Agent, or Firm*—Peter M. Kamarchik; Nicholas J. Pauley; Sam Talpalatsky

(57) ABSTRACT

Status information comprising data not stored in a memory array is efficiently read from a plurality of parallel memory devices sharing an N-bit data bus by configuring each memory device to drive the status information on a different subset M of the N bits, and tri-state the remaining N-M bits. Each memory device is additionally configured to drive zero, one or more data strobes associated with the subset M, and tri-state the remaining data strobes. A memory controller may simultaneously read status information from two or more memory devices in parallel, with each memory device driving a separate subset M of the N-bit bus. Each memory device may serialize the status information, and drive it on the subset M of the bus in burst form. Each memory device may include a configuration register initialized by a memory controller to define its subset M.

38 Claims, 7 Drawing Sheets

CONCURRENT STATUS REGISTER READ

BACKGROUND

The present invention relates generally to the field of memory devices and in particular to a concurrent read of status information from two or more memory devices.

Portable electronic devices have become ubiquitous accoutrements to modern life. Two relentless trends in portable electronic devices are increased functionality and decreased size. Increased functionality demands higher computing power and more memory. The decreasing size of portable electronic devices places a premium on power consumption, as smaller batteries can store and deliver less power. Thus, advances that increase performance and decrease power consumption are advantageous in general, and in particular for portable electronic devices.

Most portable electronic devices include some form of Dynamic Random Access Memory (DRAM) to store instructions and data for a processor or other controller. DRAM is the most cost-effective solid-state memory technology available. Synchronous DRAM (SDRAM) offers both improved performance and simplified interface design over conventional DRAM by aligning all control signals and data transfer cycles to clock edges. Double data rate (DDR) SDRAM allows data transfers on both rising and falling edges of the clock, providing still higher performance.

A basic aspect of all DRAM operation is that the capacitive charge storing data at each bit position must be periodically renewed to preserve the data state. The DRAM array is refreshed by row; some SDRAM devices may refresh the same row in multiple DRAM banks at the same time. Each row in the DRAM array must be refreshed within a specified refresh period. The DRAM rows may be refreshed sequentially once per refresh period, known as a burst refresh. However, this prevents access to the DRAM array for the time necessary to cycle through all of the rows, and imposes a significant performance degradation. Alternatively, refresh cycles directed to each row may be spread evenly throughout the refresh period, interspersed with read and write data transfers. This is known as distributed refresh. Distributed refresh is more commonly implemented, as it imposes less of a performance penalty.

Co-pending U.S. patent application "Directed Autorefresh Synchronization," Ser. No. 11/115,915, filed on Apr. 27, 2004, and assigned to the assignee of the present invention, is incorporated herein by reference in its entirety. This application discloses an auto-refresh option, wherein a refresh row counter is maintained in the SDRAM device. In auto-refresh mode, a memory controller such as a processor must supply only periodic refresh commands; the SDRAM device takes care of sequencing refresh row addresses. Whether in a traditional refresh mode (when the processor must provide refresh row addresses) or in an auto-refresh mode, the timing of the refresh command is determined by the memory controller.

The total required refresh period, and hence the spacing of refresh cycles in a distributed refresh operation, depends on the temperature of the DRAM array die. As a general rule of thumb, the refresh rate must be doubled for every 10° C. increase in the DRAM array die temperature. The refresh period specified for a SDRAM device is typically that required by the DRAM at its highest anticipated operation temperature. Thus, whenever the DRAM array die is at a lower temperature, the refresh period is longer, and the distributed refresh cycles may be spaced further apart, thus reducing their impact on DRAM read and write accesses. This would both improve processor performance and reduce power consumption by eliminating unnecessary refresh activity.

Co-pending U.S. patent application "Register Read for Volatile Memory," Ser. No. 11/128,829, filed on May 13, 2005, and assigned to the assignee of the present invention, is incorporated herein by reference in its entirety. This patent application discloses a SDRAM device having a temperature sensor, and defines a Status Register Read (SRR) operation that resembles a data read operation in timing and operation, to read the temperature sensor output. The SRR command is defined herein as a Mode Register Set (MRS) command with the bank select lines driven to 2'b10, followed by a READ command. The address bits during the MRS command select the status information to be read. For example, in one embodiment, SDRAM die temperature information may be read by driving all address bits to 0x0 during the MRS command. Other status information (e.g., the contents of the mode or extended mode registers, ID information, and the like) may be mapped to other addresses.

The SRR command may accesses information associated with the temperature of the DRAM die. This information may comprise the actual temperature of the die, the uncalibrated output value of a temperature sensor, the minimum refresh rate required for the current temperature, a refresh rate multiplier based on the current temperature, or other temperature-related information from which the controller may ascertain the required refresh rate. As used herein, all such information is referred to as temperature information, and is distinct from any data stored in the DRAM array.

Using the SRR operation, a memory controller, such as a processor, may periodically read the output of the temperature sensor and calculate the actual minimum required refresh rate. During transient thermal conditions, such as on initial power-up or when "waking" from a battery power-saving "sleep" mode, the controller may read the temperature sensor relatively often, such as every four to six microseconds, to dynamically optimize the refresh rate. When the DRAM die temperature stabilizes, the controller may reduce the frequency of status register read operations, to devote greater bus bandwidth to memory access and refresh operations. Because the SRR operation timings are similar to those of READ operations to data in the DRAM array, SRR operations may be integrated into regular memory accesses.

Sequentially reading status information, such as temperature, separately from each DRAM device in each memory subsystem rank (i.e., each DRAM device tied to the same chip select signal) consumes available memory bandwidth that could otherwise be used to perform pending memory accesses to read, write, and refresh the memory array. Reducing the number of SRR operations would improve memory system performance, and would reduce power consumption by requiring fewer memory accesses.

SUMMARY

According to one or more embodiments, status information comprising data not stored in a memory array is efficiently read from a plurality of parallel memory devices sharing an N-bit data bus by configuring each memory device to drive its status information on a different subset M of the N bits, and tri-state the remaining N-M bits. Each memory device is additionally configured to drive zero, one or more data strobes associated with the subset M, and tri-state the remaining data strobes. A memory controller may simultaneously read status information from two or more memory devices in parallel, with each memory device driving a separate subset M of the N-bit bus. Each memory device may serialize the status information, and drive it on the subset M of the bus in burst form.

One embodiment relates to a method of reading status information from a plurality of parallel memory devices sharing an N-bit data bus. Each memory device is configured to drive the status information on a different subset M of the N bits and tri-state the remaining N-M bits. Status information is then simultaneously read from the plurality of memory devices.

Another embodiment relates to a memory device having an N-bit data interface. The memory device includes a plurality of addressable data storage locations, the read access of which drive data on all N bits of the data interface. The memory device additionally includes one or more status information storage locations, the read access of which drive status information on a configurable subset M of the N bits of the data interface.

Yet another embodiment relates to a memory controller. The controller includes an N-bit, bidirectional data bus and control signal outputs. The controller also includes a control circuit operative to configure a plurality of memory devices to each drive status information on a different subset M of the N bits and to tri-state the remaining N-M bits during status information read commands, and further operative to read status information from the plurality of memory devices in the same status information read operation.

Still another embodiment relates to a method of reading status information from a SDRAM module. A mode register set (MRS) operation with a unique encoding of bank select signals is performed on the SDRAM module, followed by a synchronous READ operation. The status information is then synchronously read.

DETAILED DESCRIPTION

Figure 1:
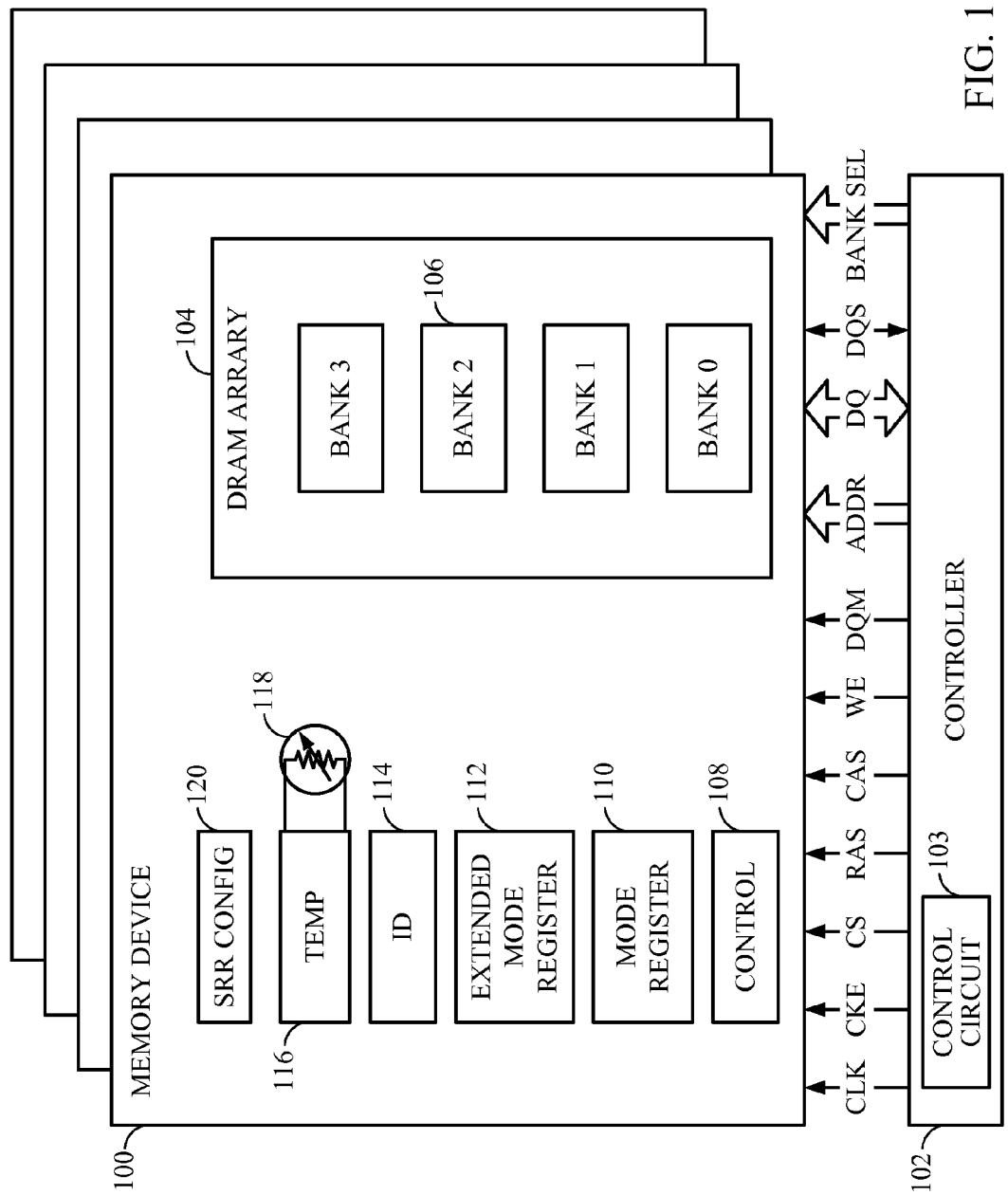
FIG. 1 is a functional block diagram of one or more memory devices and a controller.

FIG. 1 depicts one or more SDRAM memory devices 100 and a controller 102. The controller may comprise a processor, digital signal processor, micro controller, state machine, or the like, and includes a control circuit 103 that controls SDRAM accesses. The controller 102 directs operations to the SDRAM devices 100 by control signals Clock (CLK), Clock Enable (CKE), Chip Select (CS), Row Address Strobe (RAS), Column Address Strobe (CAS), Write Enable (WE), and Data Qualifiers (DQM) as well known in the art. In particular, the SDRAM devices 100 may be grouped in ranks, ordered by the Chip Select signals. The controller 102 provides a plurality of address lines and bank select lines to the SDRAM devices 100 and a bi-directional data bus connects the controller 102 and each SDRAM device 100. Each SDRAM device 100 includes a DRAM array 104, which may be divided into a plurality of banks 106. The DRAM array 104 stores instructions and data, and is read from, written to, and refreshed by control circuit 108, under the direction of the controller 102.

Each SDRAM device 100 may additionally include a mode register 110 and extended mode register 112. An SDRAM device 100 may additionally include identification information 114, such as vendor ID and version number. The identification information 114 may be stored in a register; alternatively, it may be hardwired into the die.

The SDRAM device 100 additionally includes a temperature sensing circuit 116, including one or more temperature sensors such as a thermister 118 disposed adjacent the DRAM array 104 and operative to sense the temperature of the DRAM array die. The contents of the mode register 110 and extended mode register 112, the SDRAM device identification 114 and the output of the temperature sensor 116 are all examples of data that may be read from a SDRAM device 100, but that are not stored in the DRAM array 104. As used herein, such information is referred to as "status information."

Figure 2:
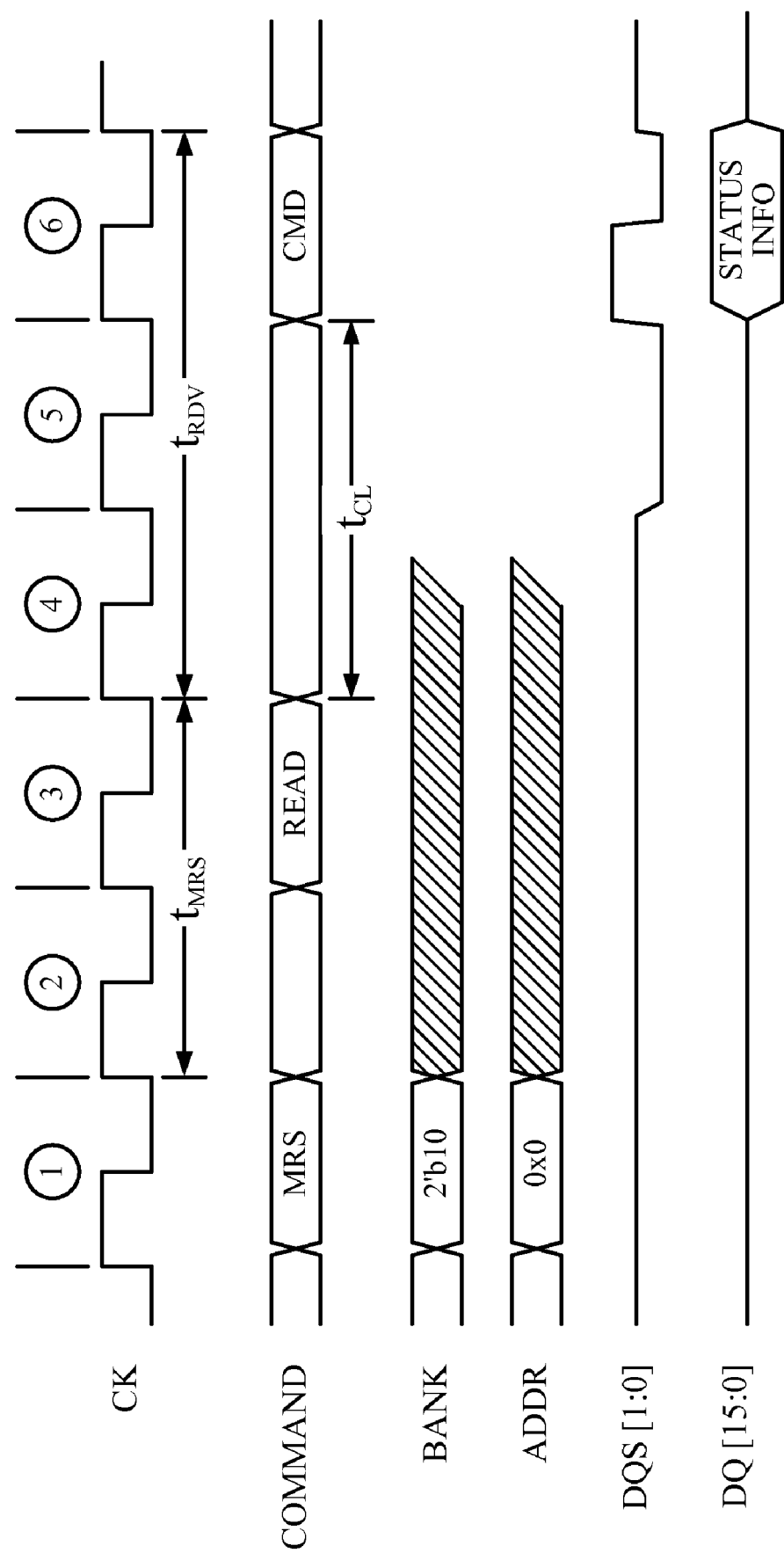
FIG. 2 is a timing diagram of a SRR operation.

FIG. 2 depicts a timing a diagram of a SRR operation to read status information, according to one embodiment. Initially, a MRS command is issued on the SDRAM control signals, with the bank select bits set to 2'b10 and an address of 0x0 (a read of other status register locations is specified by a different value on the address bus). Following the minimum MRS time $t_{MRS}$, a conventional READ command is issued. The SDRAM device outputs status information onto the data bus following the programmed CAS latency $t_{CL}$, in lieu of data from the DRAM array, but otherwise following the timings and sequencing of a conventional SDRAM read operation. A new command may be issued to the SDRAM device following the data transfer of status information.

According to one or more embodiments, when a read of status information requires less than the full N-bit SDRAM data bus, the status information may be advantageously driven on a subset M of the N bits, with the remaining N-M bits being tri-stated during a SRR operation. The information regarding which bits of the data bus to utilize for SRR operations—referred to herein as SRR configuration information—is written by the controller 102 to a SRR configuration register 120 (see FIG. 1), such as during system initialization. SRR configuration information is one type of status information. The SRR configuration register 120 may comprise an addressable location in the status information address space, as depicted in FIG. 2, or may alternatively comprise unused bits in the mode register 110 or extended mode register 112. As another alternative, one or more pins of the SDRAM device 100 may be tied to power or ground during system design, to configure the data bus subset for each SDRAM device 100 to use during SRR operations.

Figure 3:
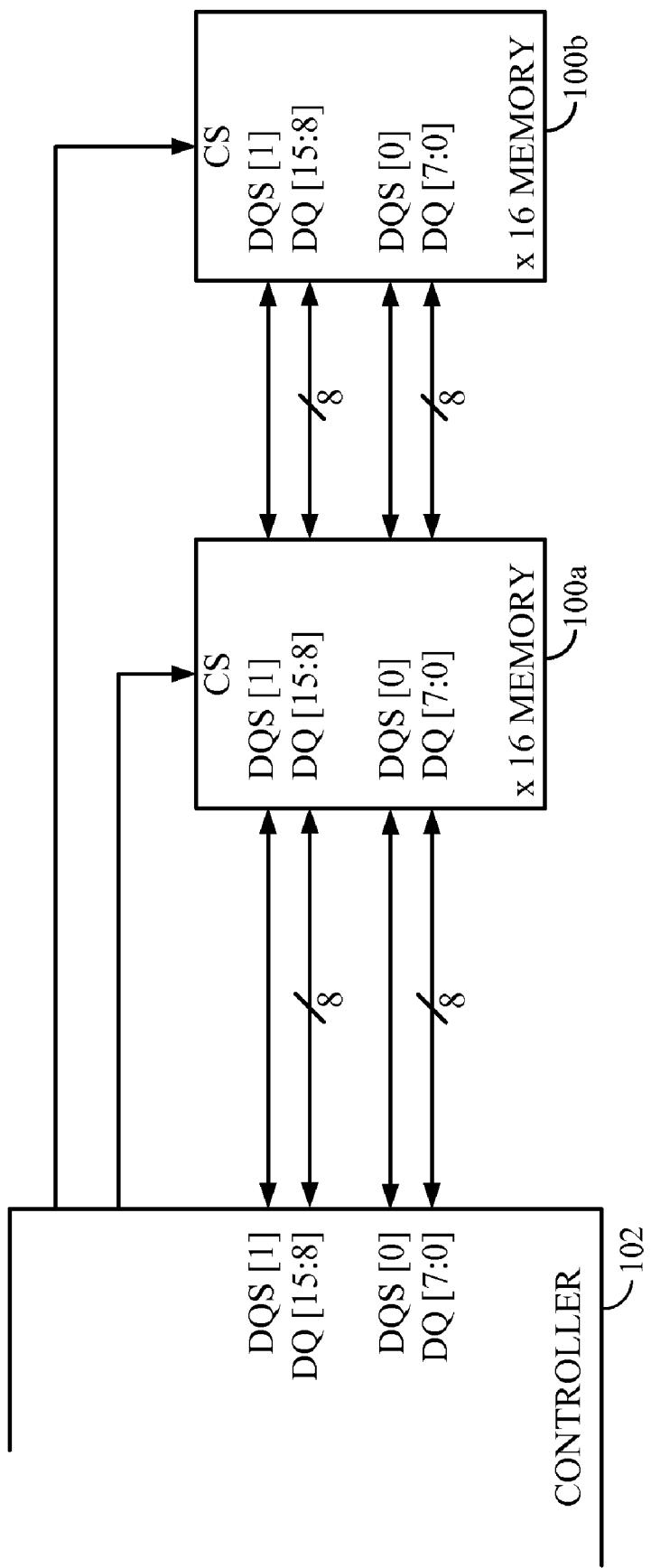
FIG. 3 is a functional block diagram of a 2-rank, ×16 memory subsystem.

FIG. 3 depicts a functional block diagram of a 2-rank, ×16 SDRAM device system topology comprising a controller 102 and two SDRAM devices 100a and 100b. SDRAM device 100a, forming memory rank 0, is connected to Chip Select line 0, and SDRAM device 100b, forming memory rank 1, is connected to Chip Select line 1. The 16-bit data bus (DQ[15:0]) is depicted in FIG. 3 as separate byte lanes DQ[7:0] and DQ[15:8], controlled by byte data strobes DQS[0] and DQS[1], respectively, for ease of explication of one or more embodiments of the present invention, as will be clear from the following discussion. Other control signals, the address bus, and the like, are connected between the controller 102 and SDRAM devices 100a and 100b in a conventional manner, and are omitted from FIG. 3 for clarity.

Figure 4:
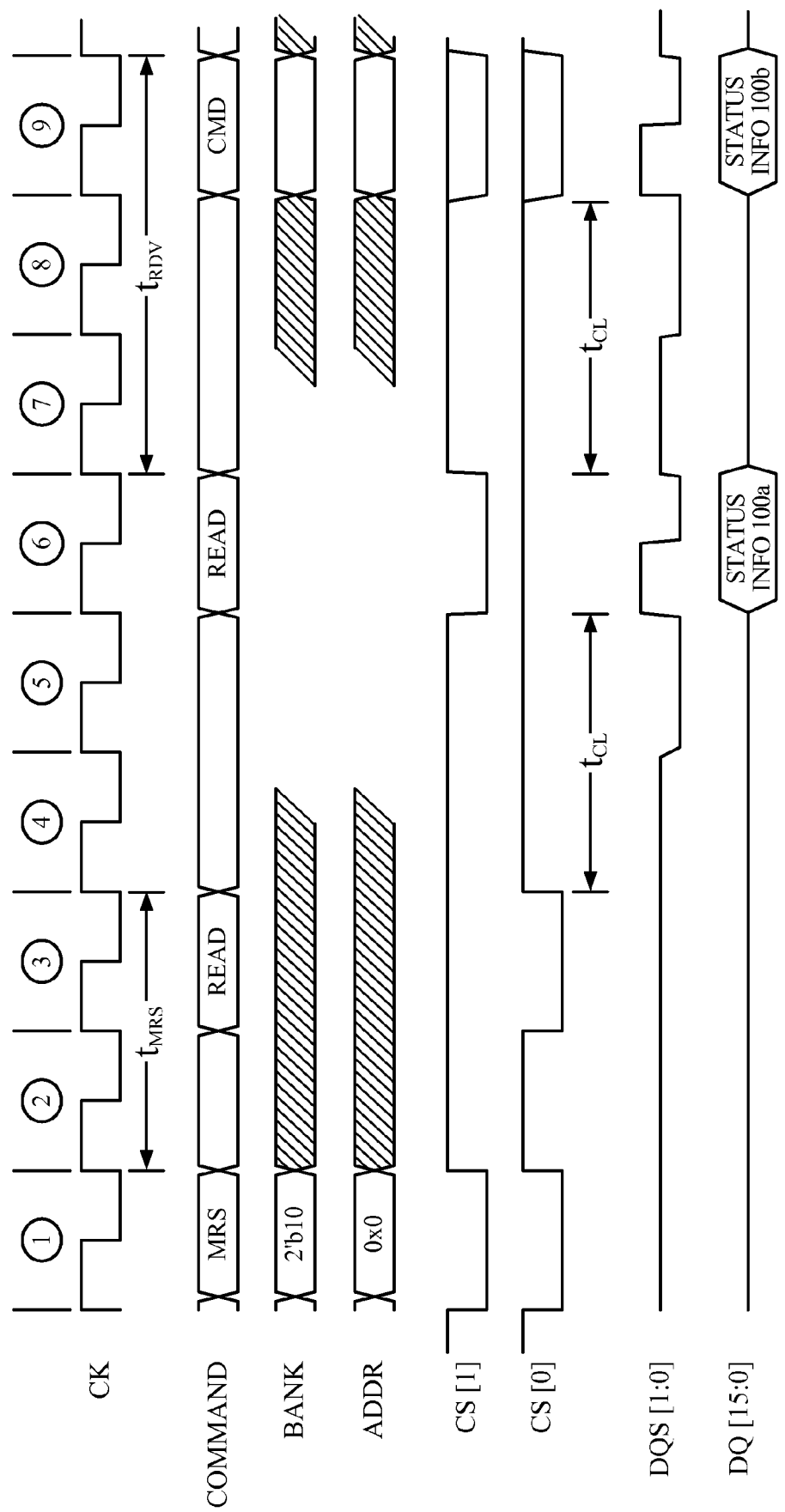
FIG. 4 is a timing diagram of a SRR operation in the memory system of FIG. 3.

FIG. 4 depicts a timing diagram representing a SRR issued in the system of FIG. 3 to read status information from the DRAM devices 100a and 100b. The controller 102 issues a MRS command in cycle 1 to both ranks (CS[0] and CS[1] both asserted), with a bank select of 2'b10 and an address of 0x0. A READ command is issued to rank 0 (only CS[0] asserted) $t_{MRS}$ cycles later, in cycle 3, and SDRAM device 100a returns status information (such as, for example, temperature information) on the data bus DQ[15:0] after the CAS latency $t_{CL}$, in cycle 6. In this cycle, the controller 102 issues a READ command to rank 1 (only CS[1] asserted), and SDRAM device 100b returns status information on the data bus DQ[15:0] after the CAS latency $t_{CL}$, in cycle 8. The controller 102 may issue another command beginning in cycle 9.

According to one or more embodiments of the present invention, each DRAM device 100 is configured to drive status information, such as temperature information, only to a subset of the data bus, and only drives the data strobes associated with that subset, during an SRR operation. The DRAM device 100 tri-states the remaining data bus and its associated data strobes. This configuration allows a second DRAM device 100 to drive status information on a different subset of the data bus, using the data strobes associated with the different subset. In this manner, two or more DRAM devices 100 may simultaneously drive status information on the data bus during a SRR operation, allowing the controller 102 to simultaneously read status information from two or more DRAM devices 100 at a time. This technique reduces the bus bandwidth dedicated to the SRR operation, freeing the available bandwidth for pending read, write, and refresh operations to the DRAM array.

In one or more embodiments, in the event the status information cannot be fully driven on the configured subset of the data bus during an SRR operation, the SDRAM device 100 automatically serializes the status information, and drives it on the configured to subset of the data bus in successive bus cycles. This feature takes advantage of the burst capability of the SDRAM device 100 when the width of the status information exceeds the configured data bus subset for one or more SDRAM devices 100. In one embodiment, the serialized status information is successively driven on the configured data bus subset according to the burst parameters configured in the mode register 110 and/or extended mode register 112, pertaining to burst READ operations directed to data stored in the DRAM array 104.

Figure 5:
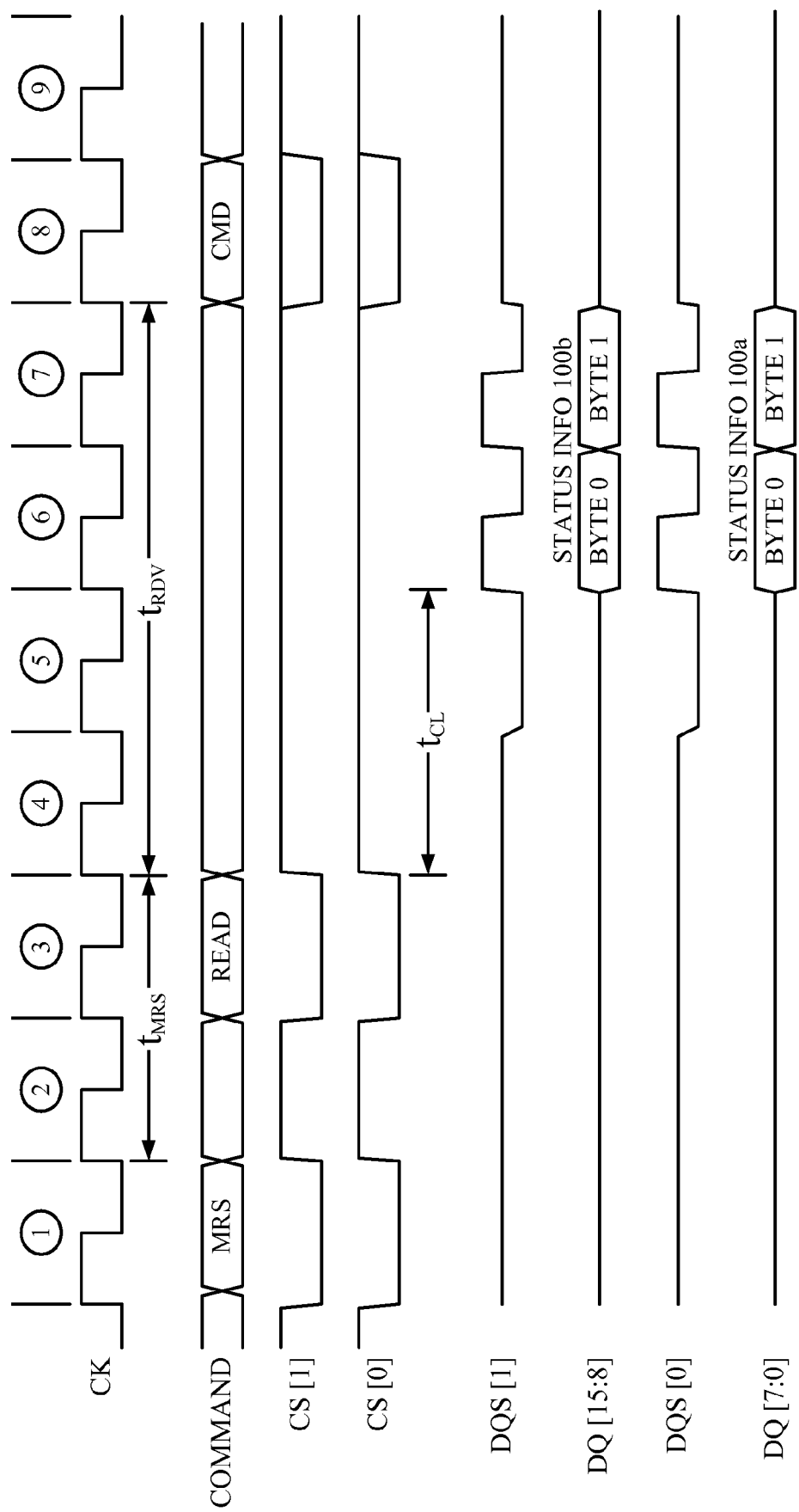
FIG. 5 is a timing diagram of a concurrent SRR operation in the memory system of FIG. 3.

FIG. 5 depicts a timing diagram of a concurrent SRR operation in the memory system of FIG. 3, wherein the rank 0 SDRAM device 100a has been configured to utilize its lower byte lane DQ[7:0], and the rank 1 SDRAM device 100b has been configured to utilize its upper byte lane DQ[15:8] during SRR operations. The controller 102 issues a MRS command in cycle 1 to both ranks (CS[0] and CS[1] both asserted), with a bank select of 2'b10 and an address of 0x0 (the bank select and address buses are not depicted in FIG. 5). A READ command is simultaneously issued to both ranks (CS[0] and CS[1] both asserted) $t_{MRS}$ cycles later, in cycle 3. After the CAS latency $t_{CL}$, in cycle 6, the rank 0 SDRAM device 100a returns the first byte of status information (such as temperature information) on the data bus bits DQ[7:0] and drives DQS[0], and in cycle 7 drives DQ[7:0] with the second byte of status information (with subsequent serial burst transfers as necessary, depending on the size of the status information to be transferred and the SDRAM device 100a burst configuration parameters). Simultaneously (with possible variations in $t_{AC}$, the access timing of DQs from CLK, which is a characteristic of each individual SDRAM component), the rank 1 SDRAM device 100b returns the first byte of status information on the data bus bits DQ[15:8] and drives DQS[1] in cycle 6, and in cycle 7 drives DQ[15:8] with the second byte of status information. The controller 102 may issue another command beginning in cycle 7.

Comparing the timing diagram of FIG. 5 to that of FIG. 4 reveals that, for a CAS latency $t_{CL}$=2 cycles in a 2-rank memory subsystem, the conventional SRR operation depicted in FIG. 4 requires a total of eight cycles from the initial MRS command to receiving all status information from both ranks. In contrast, the concurrent SRR operation depicted in FIG. 5 requires a total of only six cycles from the initial MRS command to receiving all status information from both ranks. The concurrent SRR operation according to this embodiment results in a 25% reduction in SRR overhead—or bus bandwidth consumed—as compared to the conventional SRR operation. A similar analysis, considering a CAS latency $t_{CL}$=3 cycles, yields a 22% reduction in the overhead of concurrent SRR operation as compared with conventional SRR operation.

Figure 6:
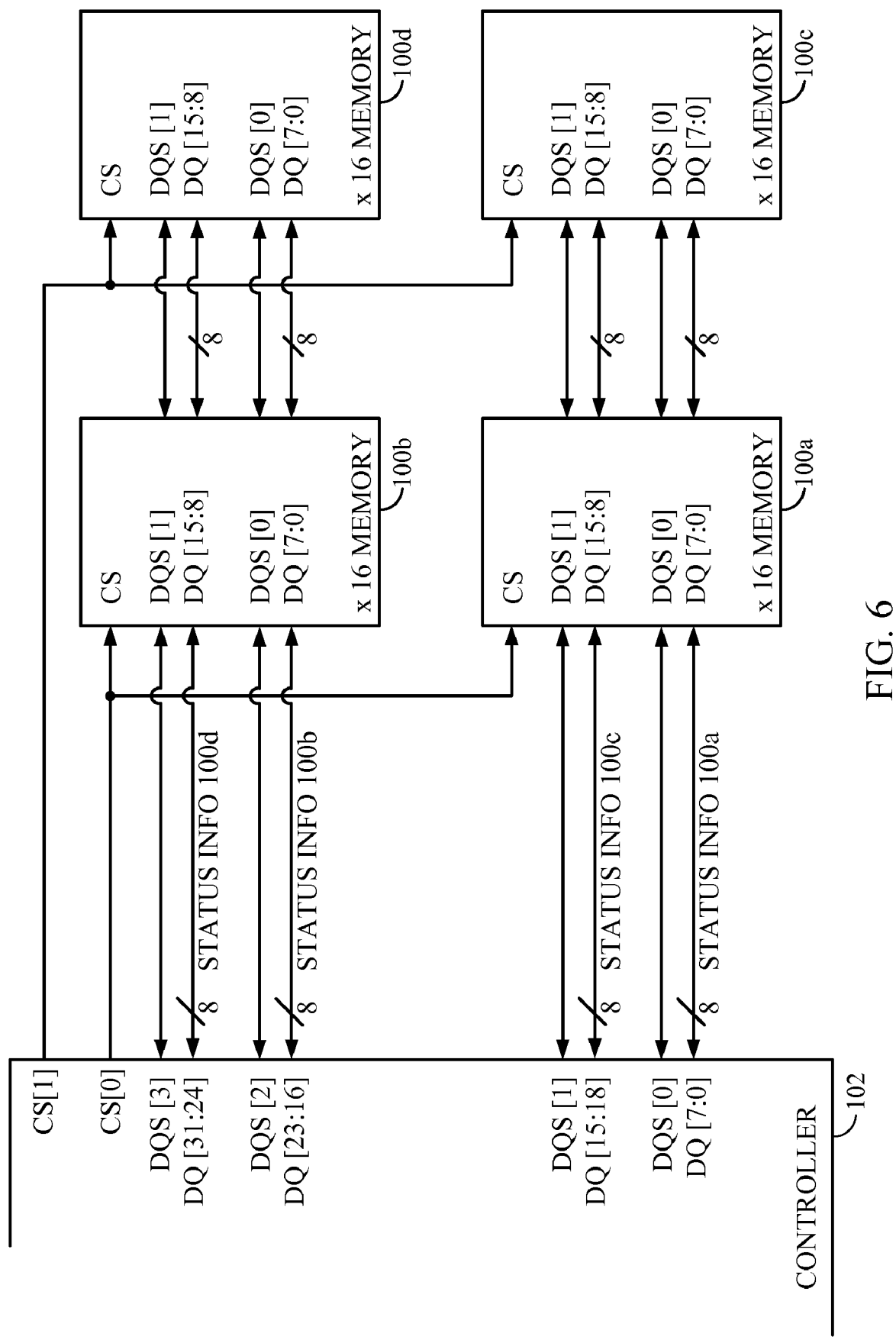
FIG. 6 is a functional block diagram of a 2-rank, ×32 memory subsystem.

These embodiments of the invention are scalable to wider bus widths. FIG. 6 depicts a functional block diagram of a 2-rank, ×32 SDRAM device system topology comprising a controller 102 and four SDRAM devices 100a, 100b, 100c, and 100d. SDRAM devices 100a and 100b, forming memory rank 0, are both connected to CS[0], and SDRAM devices 100c and 100d, forming memory rank 1, are both connected to CS[1]. All SDRAM devices 100 in a given rank (i.e., 100a/100b or 100c/100d) are configured to output status information on the same subset of the data bus during a SRR operation. Conversely, parallel SDRAM devices 100 in different ranks (i.e., 100a/100c or 100b/100d) are configured to output status information on different subsets of the data bus during a SRR operation.

The 32-bit data bus (DQ[31:0]) and four data strobes (DQS[3:0]) are depicted as separate byte lanes in FIG. 6, with a notation indicating which SDRAM device 100a, 100b, 100c, 100d will drive its status information on the byte lane during SRR operations. Other control signals, the address bus, and the like, are connected between the controller 102 and SDRAM devices 100a, 100b, 100c, 100d in a conventional manner, and are omitted from FIG. 6 for clarity.

Figure 7:
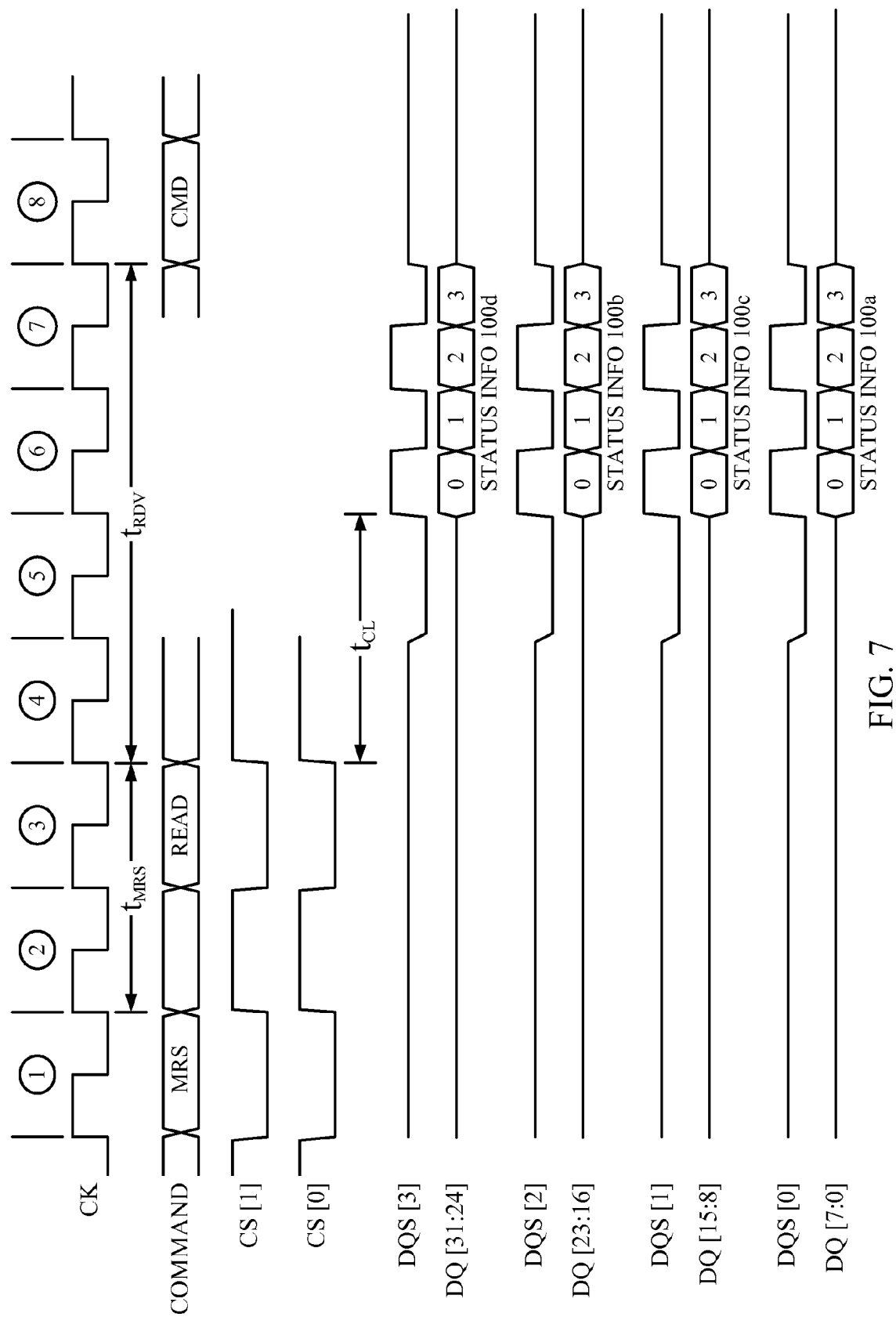
FIG. 7 is a timing diagram of a concurrent SRR operation in the memory system of FIG. 6, using DDR SDRAM.

FIG. 7 depicts a timing diagram of a concurrent SRR operation in the memory system of FIG. 6, wherein the rank 0 SDRAM devices 100a and 100b have been configured to utilize the lower byte lane DQ[7:0] and DQS[0] of each SDRAM component, and the rank 1 SDRAM devices 100c and 100d have been configured to utilize their upper byte lane DQ[15:8] and DQS[1] of each SDRAM component during SRR operations. Each SDRAM 100a, 100b, 100c, 100d tri-states the non-configured portion of its data bus during SRR operations. The timing for the SRR command signaling is the same as that depicted in FIG. 5.

In this embodiment, each SDRAM device 100a, 100b, 100c, 100d is a Double Data Rate (DDR) SDRAM, and transfers four bytes of status information in burst form. As depicted in FIGS. 6 and 7, the controller 102, utilizing the full 32-bit bus DQ[31:0], receives status information from SDRAM device 100a (rank 0) on byte lane [7:0]; from SDRAM device 100c (rank 1) on byte lane [15:8], from SDRAM device 100b (rank 0) on byte lane [23:16], and from SDRAM device 100d (rank 1) on byte lane [31:24]. In this manner, two bytes of status information are received from each SDRAM device 100a, 100b, 100c, 100d in each cycle. As FIG. 7 depicts, using the concurrent SRR operation, four bytes of status information are read from each DRAM device 100a, 100b, 100c, 100d in seven cycles. Using a conventional SRR operation to read status information from each DRAM device 100a, 100b, 100c, 100d in turn would require 15 cycles. Accordingly, in this example, the concurrent SRR operation represents over a 50% decrease in SRR overhead.

The present invention is also scalable to greater than 2-rank systems, such as by issuing pairs of concurrent SRR commands. Alternatively, each SDRAM device 100 may be configured to use a smaller subset of its data bus (e.g., a nibble), and serialize the status information output as required. In this embodiment, one of two SDRAM devices 100 configured to use the same data bus byte lane may be configured to control the associated data bus strobe, with the other SDRAM device 100 configured to tri-state all data bus strobes. Such design decisions are well within the capability of those skilled in the art, and many other configurations and applications will be readily apparent to those of skill in the art, given the teaching of this disclosure.

In general, for any parallel memory devices sharing an N-bit data bus, according to one or more embodiments of the present invention, each memory device may be configured to drive status information on a different subset M of the N bits and tri-state the remaining N-M bits. Additionally, each device may be configured to drive zero, one, or more data bus strobes associated with the subset M of the N-bit data bus. In the embodiments depicted in FIGS. 3 and 6, N=16 and M=8. Other values of N and M are within the scope of the present invention.

Although described herein with reference to SDRAM memory devices 100, the present invention is not limited to SDRAM, and may be advantageously applied to read status information from any memory device. Similarly, while the status information has been described herein as temperature information related to the DRAM array 104, used to control a refresh rate, the present invention is not limited to temperature information or refresh rate control. As used herein, status information refers to any data read from a memory device other than data stored in the memory array, and may for example include a device ID 114, the contents of the mode register 110 or extended mode register 112, the contents of a SRR configuration register 120, or any other data not stored in the memory array 104. Note that a Status Register Read (SRR) command or operation may not necessarily read an actual register.

Although the present invention has been described herein with respect to particular features, aspects and embodiments thereof, it will be apparent that numerous variations, modifications, and other embodiments are possible within the broad scope of the present invention, and accordingly, all variations, modifications and embodiments are to be regarded as being within the scope of the invention. The present embodiments are therefore to be construed in all aspects as illustrative and not restrictive and all changes coming within the meaning and equivalency range of the appended claims are intended to be embraced therein.

What is claimed is:

1. A method of reading status information, the method comprising:
    configuring each of a plurality of parallel memory devices sharing an N-bit data bus to drive corresponding status information on a different subset of M of the N bits of the N-bit data bus and to tri-state N-M bits of the N-bit data bus; and
    reading the status information from the plurality of memory devices in a status information read operation.

2. The method of claim 1, wherein reading status information from the plurality of memory devices in the status information read operation comprises simultaneously issuing a mode register set (MRS) command with a unique bank select bit encoding, followed by a READ command, to the plurality of memory devices.

3. The method of claim 2, wherein the unique bank select bit encoding is 2'b10.

4. The method of claim 2, wherein the status information to be read from the memory devices is selected with an address bus value.

5. The method of claim 1, further comprising configuring each memory device to drive zero, one, or more data strobe (DQS) signals corresponding to the subset of M of the N bits on which the memory device is configured to drive the corresponding status information, and to tri-state the remaining DQS signals.

6. The method of claim 1, wherein reading the status information from the plurality of memory devices in the status information read operation comprises sequentially reading the status information from the plurality of memory devices in two or more data transfer cycles, wherein at least one memory device serializes its status information and successively drives partial status information on its configured subset of M of the N bits, and tri-states N-M bits in each data transfer cycle.

7. The method of claim 1, wherein reading the status information from the plurality of memory devices in the status information read operation comprises reading temperature information associated with a memory array on each memory device in the same status information read operation.

8. The method of claim 1, wherein reading the status information from the plurality of memory devices in the status information read operation comprises reading a register on each memory device in the same status information read operation.

9. The method of claim 1, wherein configuring each memory device to drive the status information on a different subset of M of the N bits comprises setting configuration bits in a register.

10. The method of claim 1, wherein configuring each memory device to drive the status information on a different subset of M of the N bits comprises tying configuration pins on each memory device to a predetermined logic level.

11. The method of claim 1, further comprising:
    performing a mode register set (MRS) operation with a unique encoding of bank select signals on the memory devices, followed by performing a synchronous READ operation on the plurality of parallel memory devices; and
    synchronously reading the status information.

12. The method of claim 11, wherein the unique encoding of bank select signals is 2'b10.

13. The method of claim 11, wherein the status information to be read is selected by the value on an address bus during the MRS operation.

14. The method of claim115, wherein synchronously reading the status information comprises reading the status information according to signal timing defined for the synchronous READ operation.

15. The method of claim 14, wherein reading the status information according to signal timing defined for the synchronous READ operation comprises sequentially reading the status information in a burst.

16. A memory device having an N-bit data interface, the memory device comprising:
    a plurality of addressable data storage locations, a read access of which drives data on all N bits of the data interface; and one or more status information locations, the read access of which drives status information on a configurable subset M of the N bits of the data interface,
wherein during the read access of a status information location the memory device tri-states N-M bits of the data interface.

17. A memory device having an N-bit data interface, the memory device comprising:
a plurality of addressable data storage locations, a read access of which drives data on all N bits of the data interface; and
one or more status information locations, the read access of which drives status information on a configurable subset M of the N bits of the data interface,
wherein during the read access of a particular status information location the memory device drives one or more DQS signals corresponding to the subset M of the N bits on which the memory device drives status information.

18. The memory device of claim 17, wherein during the read access of the particular status information location the memory device tri-states DQS signals corresponding to the remaining N-M bits of the data interface.

19. The memory device of claim 16 wherein the one or more status information locations comprise one or more registers.

20. A memory device having an N-bit data interface, the memory device comprising:
a plurality of addressable data storage locations, a read access of which drives data on all N bits of the data interface; and
one or more status information locations, the read access of which drives status information on a configurable subset M of the N bits of the data interface,
wherein the one or more status information locations comprise an output of a temperature sensor associated with a memory array in the memory device.

21. The memory device of claim 20 further comprising a register storing configuration bits specifying the configurable subset M of the N bits of the data interface.

22. The memory device of claim 20 further comprising configuration pins specifying the configurable subset M of the N bits of the data interface.

23. A memory device having an N-bit data interface, the memory device comprising:
a plurality of addressable data storage locations, a read access of which drives data on all N bits of the data interface;
one or more status information locations, the read access of which drives status information on a configurable subset M of the N bits of the data interface; and
a controller operative to serialize status information, and to successively drive partial status information on a configured subset M of the N-bit data bus in burst form.

24. A memory subsystem comprising:
two or more memory devices connected in parallel to an N-bit data bus, each memory device operative to drive status information on a different subset of M of the N bits of the N-bit data bus and tri-state N-M bits of the N-bit data bus during a status read operation; and
a controller connected to the memory devices and operative to simultaneously read the status information from the two or more memory devices via the status read operation.

25. The memory subsystem of claim 23, wherein the status read operation comprises a mode register set (MRS) command with a unique bank select bit encoding, followed by a READ command.

26. The memory subsystem of claim 24, wherein the unique bank select bit encoding is 2'b10.

27. The memory subsystem of claim 24, wherein an address bus value selects the status information to be read from the memory devices.

28. The memory subsystem of claim 24, wherein one or more of the memory devices is operative to serialize status information, and to successively drive partial status information on a configured subset of M of the N-bit data bus in burst form during the status read operation.

29. The memory subsystem of claim 24, wherein each memory device is further operative to drive zero, one, or more DQS signals associated with a configured subset of M of the N-bit data bus, and to tri-state remaining DQS signals during the status read operation.

30. A memory controller comprising:
an N-bit, bidirectional data bus;
control signal outputs; and
a control circuit operative to configure each of a plurality of memory devices to drive status information on a different subset of M of the N bits of the N-bit data bus and to tri-state N-M bits of the N-bit data bus during a status information read command, and further operative to read status information from the plurality of memory devices in a status information read operation.

31. The memory controller of claim 30, further comprising bank select output signals, and wherein the control circuit is operative to simultaneously issue a mode register set (MRS) command with a unique bank select bit encoding, followed by a READ command, to the plurality of memory devices to read status information.

32. The memory controller of claim 31, wherein the unique bank select bit encoding is 2'b10.

33. The memory controller of claim 31, further comprising address output signals, and wherein the address bus value during the MRS command selects the status information to be read from the memory devices.

34. The memory controller of claim 30, further comprising log.sub.2 N bidirectional data strobe (DQS) signals, and wherein the control circuit is further operative to configure each memory device to drive zero, one, or more DQS signals corresponding to the subset of M of the N bits on which the corresponding memory device is configured to drive status information, and to tri-state the remaining DQS signals.

35. The memory controller of claim 30, wherein the control circuit is operative to read the status information from the plurality of memory devices by sequentially reading the status information from the plurality of memory devices in two or more data transfer cycles, wherein at least one memory device serializes its status information and successively drives partial status information on its configured subset of M of the N bits of the N-bit data bus, and tri-states N-M bits, for each data transfer cycle.

36. The memory controller of claim 30, wherein the control circuit is operative to read temperature information associated with a corresponding memory array on each memory device in the status information read operation.

37. The memory controller of claim 30, wherein the control circuit is operative to read a corresponding register on each memory device in the status information read operation.

38. The memory controller of claim 30, wherein the control circuit configures each memory device to drive the status information on a different subset of M of the N bits by setting configuration bits in a corresponding register on the memory device.

* * * * *

UNITED STATES PATENT AND TRADEMARK OFFICE
CERTIFICATE OF CORRECTION

| | | |
|---|---|---|
| PATENT NO. | : 7,593,279 B2 | Page 1 of 1 |
| APPLICATION NO. | : 11/548430 | |
| DATED | : September 22, 2009 | |
| INVENTOR(S) | : Wolford et al. | |

It is certified that error appears in the above-identified patent and that said Letters Patent is hereby corrected as shown below:

Column 8, line 55, claim 14: "claim115," to read as --claim 11,--

Signed and Sealed this
Twenty-first Day of June, 2011

David J. Kappos
*Director of the United States Patent and Trademark Office*